United States Patent [19]

Duisman

[11] 4,143,235

[45] Mar. 6, 1979

[54] CADMIUM SULFIDE PHOTOVOLTAIC CELL AND METHOD OF FABRICATION

[75] Inventor: Jack A. Duisman, El Cerrito, Calif.

[73] Assignee: Chevron Research Company, San Francisco, Calif.

[21] Appl. No.: 866,082

[22] Filed: Dec. 30, 1977

[51] Int. Cl.² ............................................. H01L 31/06
[52] U.S. Cl. .......................... 136/89 CD; 136/89 TF; 357/30; 357/61; 357/63
[58] Field of Search ............ 136/89 CD, 89 TF; 357/4, 16, 30, 61, 62, 63; 427/74

[56] References Cited

U.S. PATENT DOCUMENTS

| | | | |
|---|---|---|---|
| 3,880,633 | 4/1975 | Jordan et al. | 65/60 |
| 4,086,101 | 4/1978 | Jordan et al. | 136/89 CD |

OTHER PUBLICATIONS

F. A. Shirland "The History, Design, Fabrication & Performance of CdS Thin Film Solar Cells, " *Advanced Energy Conversion,* vol. 6, pp. 201-221, (1966).
Y. Y. Ma et al., "Properties of CdS Films Prepared by Spray Pyrolysis", *J. Electrochem. Soc.,* vol. 124, pp. 1430-1435 (1977).
L. M. Fraas et al., "CdS Thin Films for Terrestrial Solar Cells", *J. Crystal Growth,* vol. 39, pp. 92-107 (1977).
J. Bougnot et al., "CdS Sprayed Thin Films-Electrical and Optical Properties", *Conf. Record,* 12*th IEEE Photovoltaic Specialists Conf.,* Nov. 1976, pp. 519-525.

*Primary Examiner*—John H. Mack
*Assistant Examiner*—Aaron Weisstuch
*Attorney, Agent, or Firm*—D. A. Newell; John Stoner, Jr.

[57] ABSTRACT

A cadmium sulfide photovoltaic cell of improved efficiency comprising a barrier layer and cadmium sulfide-containing bilayer, the bilayer being formed by depositing at a first temperature an initial layer of cadmium sulfide in interfacial contact with the substrate and then depositing a subsequent layer of cadmium sulfide at a second temperature which is at least 20° C. below the first temperature.

13 Claims, 2 Drawing Figures

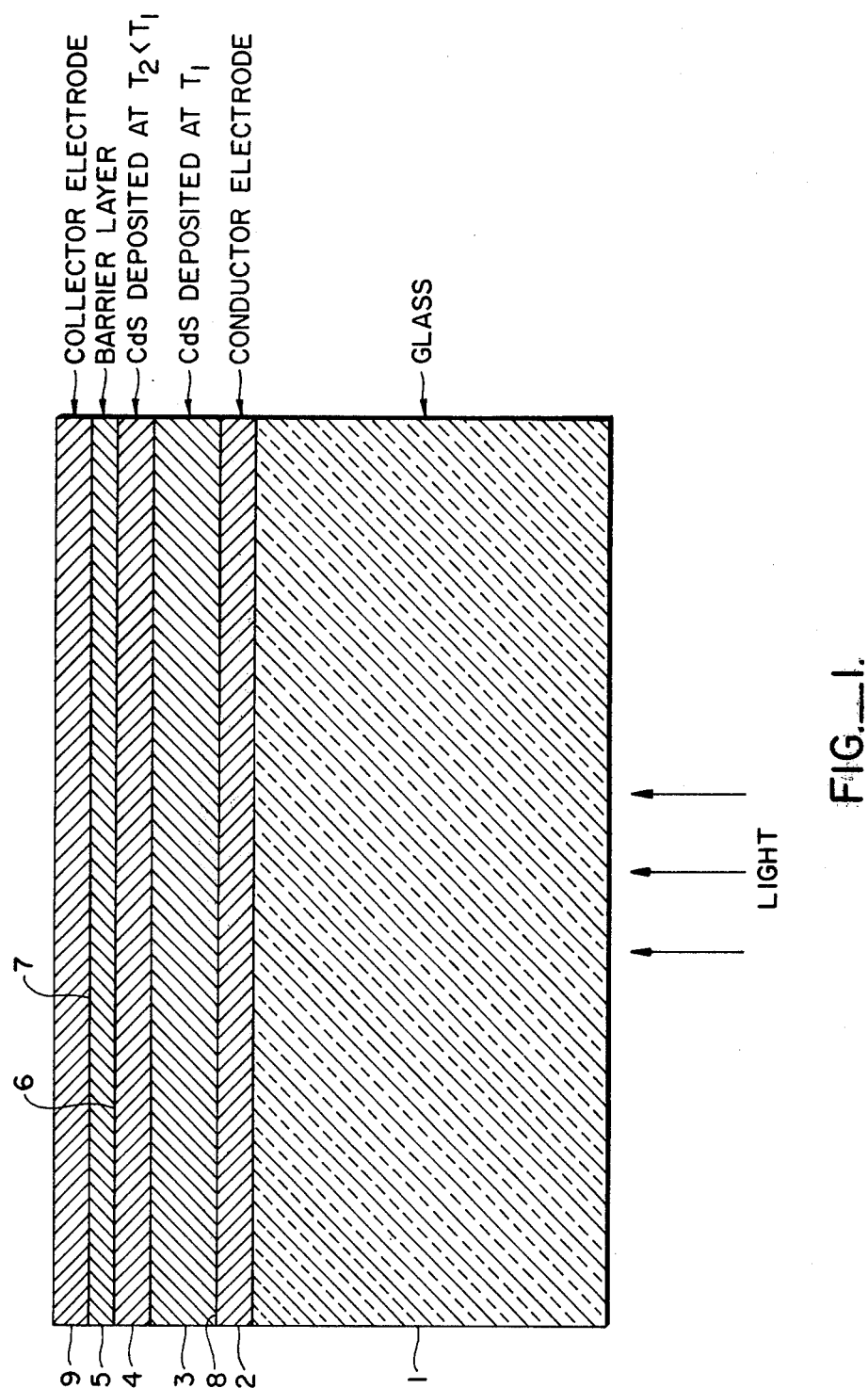
FIG._1.

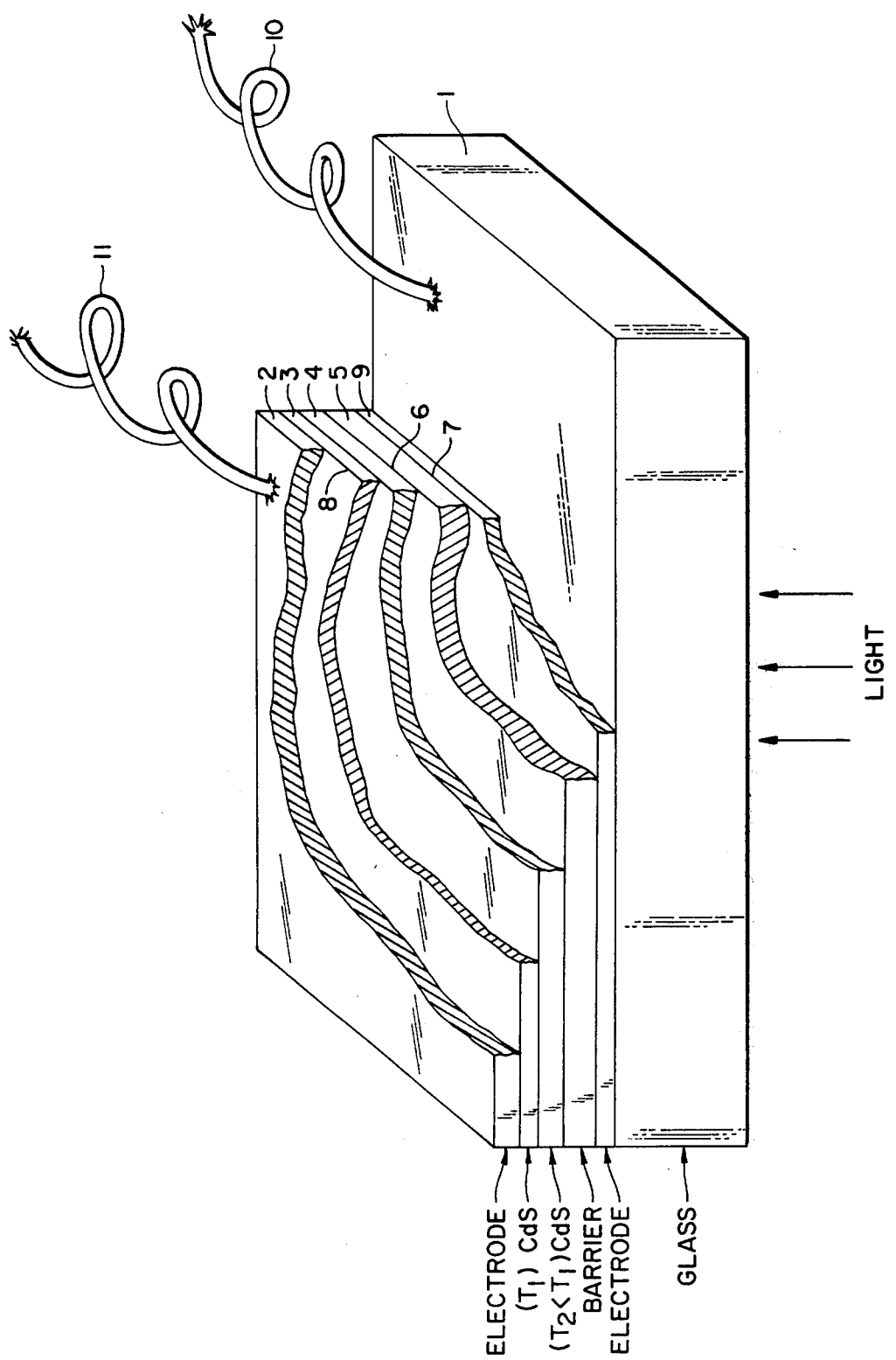
FIG._2.

CADMIUM SULFIDE PHOTOVOLTAIC CELL AND METHOD OF FABRICATION

BACKGROUND OF THE INVENTION

This invention concerns cadmium sulfide photovoltaic cells and methods of fabricating them. In particular, this invention concerns an improved cadmium sulfide photovoltaic cell which is characterized by a bilayer of cadmium sulfide. The bilayer is formed by depositing the two cadmium-containing layers at a critical difference in temperature.

Cadmium sulfide photovoltaic cells are well known. A great deal of research effort has been expended on their development and improvement. U.S. Pat. No. 2,820,841 granted to Carlson et al. on Jan. 21, 1958 describes a typical cadmium sulfide photovoltaic cell. In general, the cadmium sulfide cells comprise a layer of polycrystalline cadmium sulfide and a photovoltaic barrier layer of a Group IB metal chalcogenide in physical contact along a substantial interfacial area. The cell further comprises conducting and collecting electrodes associated with each of the layers. The interfacial contact between the cadmium sulfide layer and the barrier layer, usually copper sulfide, operates as a photovoltaic junction. It is believed that this junction is of the P-N type and that the mechanism of photovoltaic generation involves the formation of electron-hole pairs in the cadmium sulfide layer in response to the action of incident radiation having absorbable wavelengths. The charge carriers diffuse across the junction, creating a potential difference which in turn causes an electrical current to flow in an external circuit. The energy conversion efficiency of the cell depends among other things on the electrical and optical characteristics of the cadmium sulfide layer and the barrier layer.

U.S. Pat. No. 2,820,841 teaches that the resistivity of the cadmium sulfide layer can be reduced, thereby increasing the efficiency of the cell, by contaminating or "doping" the cadmium sulfide layer with indium or gallium, which darkens the layer, making it more light absorbent in the red end of the spectrum. Preferably the doping agent or dopant is applied as a film on the cadmium sulfide layer. When the cell is heat treated to activate the junction the dopant and cadmium sulfide interdiffuse. Precise control of the duration and temperature of the activation step is crucial to avoid destruction of the junction by interdiffusion of the barrier layer and the cadmium sulfide layer or by diffusion of too much of the dopant.

U.S. Pat. No. 3,880,633 granted to Jordan et al. on Apr. 29, 1975 teaches a method of continuously fabricating photovoltaic cells, particularly cadmium sulfide photovoltaic cells. According to this method, a tin oxide layer is applied to glass as the conducting electrode. After the electrode is formed, a solution of cadmium chloride and N,N-dimethylthiourea or thiourea in water, doped with aluminum chloride, is sprayed over the tin oxide electrode.

The methods described by U.S. Pat. Nos. 2,820,841 and 3,880,633 have improved cell efficiency. Cell efficiency, i.e., the ratio of electrical output power to solar energy input, has been improved to about 5%. However, if solar cells are to be utilized for large scale production of power, areas of such cells measured in square miles are required. On this basis the economic feasibility of large scale solar cell systems depends upon continued development of more efficient cells.

SUMMARY OF THE INVENTION

It has been found that the efficiency of a cadmium sulfide photovoltaic solar cell can be improved using a cadmium bilayer formed by depositing at a first temperature an initial layer of cadmium sulfide in interfacial contact with a substrate layer and depositing a second layer of cadmium sulfide at a second temperature which is at least about 20° C., preferably about 50° C., below the first deposition temperature.

BRIEF DESCRIPTION OF THE DRAWINGS

The detailed description of the photovoltaic cell of this invention will be more readily appreciated when taken in conjunction with the accompanying drawings, in which:

FIG. 1 is a cross-sectional view of a photovoltaic cell embodying the present invention; and FIG. 2 is a perspective elevational view of a further embodiment of the invention.

DETAILED DESCRIPTION OF THE INVENTION

This invention is based, among other factors, upon the surprising discovery that the efficiency of a cadmium sulfide photovoltaic cell can be significantly increased by forming a cadmium-containing bilayer comprising two cadmium sulfide layers when the final cadmium sulfide layer in interfacial contact with the barrier layer is deposited at a temperature which is at least about 20° C. below the deposition temperature of the initial cadmium sulfide layer.

Thus, the photovoltaic cell of this invention comprises a cadmium sulfide-containing bilayer formed by the reduced temperature deposition of two layers of cadmium sulfide, the second layer of cadmium sulfide being deposited at a lower temperature. The specific reasons for the improved efficiency of a photovoltaic cell comprising a cadmium bilayer are not yet known. It has been theorized that the lower cadmium sulfide lamination acts to increase the resistance of the cadmium sulfide penetration by the barrier layer and that the difference in deposition temperature of the two cadmium-containing laminations achieves particular effective crystalline structures. In particular, it has been observed that the rate of nucleation of the cadmium sulfide crystals increases as deposition temperature increases. Thus, the initial layer of the cadmium-containing bilayer, deposited at the higher temperature in interfacial contact with the barrier layer, comprises cadmium sulfide microcrystals having an average diameter of from about 0.02 microns to about 0.1 microns. The second layer of cadmium sulfide, deposited at the lower temperature, comprises cadmium sulfide crystals having an average diameter of from about 0.1 microns to about 0.5 microns.

Cadmium sulfide photovoltaic cells generally consist of a laminated composite structure having five substantially coextensive planar laminations. The five laminations are (1) a supporting substrate, (2) a conducting electrode, (3) a cadmium sulfide lamination, (4) a barrier lamination, and (5) a collecting electrode. In accordance with this invention the cadmium sulfide lamination has been modified to comprise two interdiffused layers of cadmium sulfide prepared at substantially different temperatures. As discussed herein, these two cadmium sulfide layers are collectively referred to as the "bilayer". The two parts of the bilayer may be of different thickness and have different chemical compositions and still be made using this invention. For example, an aluminum-containing compound may be added to the cadmium sulfide layer deposited in interfacial contact with the barrier layer as taught by Jordan et al. in U.S. Pat. No. 3,880,633.

Referring to FIG. 1, a photovoltaic cell which has been fabricated according to this invention is illustrated in cross-sectional view. The thickness dimension of the laminations is greatly exaggerated for clarity.

Reference numeral 1 refers to the lowermost lamination which is primarily a supporting substrate and consists, for example, of a plate of glass. The substrate is rendered electrically conductive by treating at least one surface with a chemically inert substance forming a conducting electrode 2. The conducting electrode must be chemically inert, capable of withstanding high temperatures, and transparent to those wavelengths to which the photovoltaic junction is sensitive when oriented between the cadmium bilayer and the source of incident radiation. Stannic oxide, cadmium oxide, and indium oxide are suitable materials, stannic oxide is preferred. Conductive glass, having stannic oxide fused to a surface, is commercially available under various tradenames such as "EC" and "NESA". The stannic oxide lamination is deposited by spraying a solution of stannous chloride pentahydrate and formaldehyde onto a glass substrate heated to about 500° C. The thickness of the electrode is determined by monitoring its interference color during the spraying process. Spraying is stopped when the fourth-order red (about 5400 Angstroms) is reached. The resistance of such a film is about 50 ohms/square.

In FIG. 1 the cell is oriented with the conducting electrode 2 in intimate physical contact with the lower initial cadmium sulfide layer of the bilayer of cadmium sulfide. The initial cadmium sulfide lamination, 3, consists of a very thin, for instance 0.2 to 10 micron thick, film. The lamination is substantially co-extensive with the conductor electrode 2. In fabricating the cell, cadmium sulfide lamination 3 is deposited by spray pyrolysis of a solution of cadmium sulfide, a method which is well known in the art. The exact temperature of deposition is not critical, generally ranging from about 200° C. to about 550° C., preferably from about 350° C. to about 500° C. In accordance with the embodiment of this invention shown in FIG. 1, a second cadmium sulfide lamination 4 is deposited over the initial cadmium sulfide lamination to form a bilayer of cadmium sulfide. Cadmium sulfide lamination, 4, is also deposited by spray pyrolysis at a temperature of from about 200° to about 450° C., preferably from about 300° C. to about 450° C., and consists of a thin polycrystalline film. To obtain a cell of improved efficiency, it is a critical aspect of this invention that the cadmium sulfide lamination 4 must be deposited at a temperature of from at least about 20° C. to about 100° C. below the deposition temperature of the initial cadmium sulfide lamination. Preferably the difference in deposition temperature will range from about 30° C. to about 60° C., most preferably about 50° C.

In a preferred embodiment of the improved photovoltaic cell of this invention, one of the cadmium sulfide layers 3 or 4 is doped, preferably with aluminum, usually in amounts of from about 1 to about 50 weight percent. As discussed in U.S. Pat. No. 2,820,841 and U.S. Pat. No. 3,880,633, dopants serve to reduce the resistivity of the cadmium sulfide layer, improving the efficiency of the cell. In addition, the dopant acts as a contaminant, increasing the rate of cadmium sulfide crystal nucleation. Thus, where the initial high temperature cadmium sulfide layer 3 is doped, it is believed that the rate of nucleation relative to the second low-temperature layer 4 is increased by the effects of both the higher temperature and the contaminant. Thus, the microcrystals of cadmium sulfide in the initial layer 3 containing a dopant range from about 0.01 microns to 0.05 microns.

The purity of cadmium sulfide lamination 4 should be relatively high but the exact purity will depend on the intended application of the cell. The normal color of high purity polycrystalline cadmium sulfide is canary yellow, and it will absorb wavelengths below 5200 Angstroms.

In order to complete the photovoltaic junction, the cadmium bilayer is substantially co-extensive with a microscopically thin film, from about 0.01 to 0.1 micron in thickness, of a barrier material comprising monovalent cations of a metal from Group IB of the Periodic Table, that is copper, silver or gold. Preferably, the barrier lamination 5 is composed of a cuprous compound such as copper oxide or copper sulfide. The specific thickness of this lamination is not generally critical. However, if incident radiation passes through the barrier lamination before it has access to the junction, it must be thin enough that it does not disturb optical absorption by the barrier close to the bilayer. In FIG. 1 the cell is oriented so that incident radiation has access to the bilayer before passing to the barrier layer. Thus the cell illustrated in FIG. 1 is not particularly sensitive to the thickness of the barrier layer.

The interface at 6 of barrier lamination 5 and the bilayer comprising the two cadmium sulfide laminations 3 and 4 forms the photovoltaic junction. The surfaces 7 and 8 of laminations 5 and 3, respectively, are characteristically known as the "external" surfaces. At least one of the surfaces 7 and 8 must be adapted for exposure to photoeffective radiation which in turn has access to the bilayer through layer 3 and subsequently layer 4. Regardless of the direction of the incident radiation, the barrier layer must be thick enough to absorb essentially all of the photoeffective radiation with charge carrier formation.

The final uppermost lamination 9 of the cell illustrated in FIG. 1 is a collector electrode, preferably of a material which is capable of making ohmic or non-rectifying contact with the barrier layer, such as indium or gallium. The thickness of lamination 9 is not critical.

The cell thus far described and illustrated in FIG. 1 comprises the essential elements of an effective photovoltaic cell. Another embodiment is illustrated in FIG. 2. The cell illustrated in FIG. 2 comprises the same essential elements (designated by like reference numerals) as the cell shown in FIG. 1. However, the cell in FIG. 2 having barrier lamination 5 and the bilayer comprising laminations 3 and 4 in reversed order relative to the supporting lamination 1 illustrates that the laminations can be reordered to form an effective cell. In addition, the cell in FIG. 2 is fitted with conductive leads 10 and 11 secured to the conducting and collecting electrodes to complete a suitable electric circuit.

The photovoltaic cell of this invention is fabricated by known methods. Some of the more critical aspects such as formation of the bilayer have been discussed with reference to the cell structure. Previous research efforts have identified other variables which have an effect on the cell efficiency. One of the advantages of this invention is its compatibility with prior advances in the art. For general guidance in fabricating a cell as illustrated in FIGS. 1 and 2, the continuous process described in U.S. Pat. No. 3,880,533 which uses a floating plate of glass and a series of spray pyrolysis depositions is preferred. The conditions and method of the process described by Jordan et al. in U.S. Pat. No. 3,880,533 are incorporated herein by reference. Of course, the process must be adapted to the fabrication of a photovoltaic cell comprising a cadmium bilayer, if necessary by adding a second cadmium sulfide spray deposition, and by controlling the deposition temperature to insure that the critical temperature difference is maintained during formation of the bilayer.

Following depositions of the barrier lamination and the bilayer the cell is subjected to a heat treatment, usually at a temperature of from about 100° C. to about 300° C., which actuates the photovoltaic junction. The heat treatment apparently causes solid state diffusion between the barrier lamination and the bilayer thereby forming the P-type material which with the N-type cadmium bilayer forms a P-N junction. In addition, the activation step causes diffusion between the two cadmium sulfide containing laminations. Thus, while FIGS. 1 and 2 illustrate a cell structure having well defined laminations, the interfaces of the lamination are in fact diffused to some extent. The diffusion caused by activation must be controlled to avoid complete destruction of the interfaces, and can be monitored by periodically checking the electrical potential generated by the cell using a referenced photoeffective illumination.

EXAMPLES

The photovoltaic cell and its fabrication are further illustrated by the following example which is not intended to limit the claims which follow.

EXAMPLE I

A piece of glass previously coated with a transparent film of $In_2O_3$ was cleaned and heated to 400° C., whereupon a solution of 0.032 mol per liter $CdCl_2$ and 0.039 mol per liter thiourea was sprayed slowly on the coated surface for 160 minutes.

In order to complete the solar cell junction, a piece of the glass plate was heat treated at 475° C. for 30 minutes, cooled to room temperature, and immersed in a solution consisting of 700 ml $H_2O$, 3.8 g KCl, 1.5 g tartaric acid, 1.5 g CuCl, 1.0 g $CeSo_4 2H_2O$ and 23 ml of 0.5 molar HCl. After immersion and rinsing, the specimens were dried for two minutes at 250° C., and then a metallic electrode was applied to the cell. The electrode was 1.0 cm$^2$ in area and consisted of a lower layer of copper vacuum evaporated onto the $Cu_2S$ barrier followed by a layer of gold vacuum evaporated onto the copper. The purpose of the gold was to protect the copper from oxidation by air.

Finally, the solar cell was given a heat treatment for 10 minutes at 220° C. and tested with water-filtered artificial light. Its intensity was 75 milliwatts per square centimeter. This solar cell had an open circuit voltage of 0.173 volt and a short-circuit current of 17.7 milliamperes.

EXAMPLE II

A solar cell was prepared in the same manner as in Example I except that the cadmium sulfide layer was spray deposited in two sections, the lower for 80 minutes at 450° C., the upper for 120 minutes at 400° C. The longer total deposition time was used to compensate for the previously observed fact that the CdS deposition rate is lower at higher temperatures. When the cell was tested precisely as was the cell in Example I, the open-circuit voltage was higher, 0.283 volt and the short-circuit current was almost unchanged, 17.2 milliamperes.

EXAMPLE III

A solar cell was prepared as in Example I except that aluminum chloride dopant was added to part of the spray solution. The spray solution composition was 0.024 mol per liter $CdCl_2$, 0.008 mol per liter $AlCl_3$, and 0.044 mol per liter thiourea, sprayed at 400° C. for 105 minutes. Then, a solution of the composition in Example I was sprayed at 400° C. for an additional 35 minutes. When completed and tested as in Example I, this solar cell had an open-circuit voltage of 0.413 volt, a short-circuit current of 20.3 milliamperes, and its fill factor was 0.45. Its efficiency was 5.0%.

EXAMPLE IV

A solar cell was prepared in the same manner as Example III except that the spray deposition temperature was 450° C. instead of 400° C. This solar cell was tested as in Example I. It had an open circuit voltage of 0.392 volt, a short-circuit current of 15.3 milliamperes and its fill factor was 0.62. Its efficiency was 5.0%.

EXAMPLE V

A solar cell was prepared in the same manner as Example III except that the aluminum containing lower layer was deposited at a temperature of 450° C. for 180 minutes. The longer time was used to compensate for the slower deposition rate at this temperature. When tested as in Example I, this solar cell had an open circuit voltage of 0.405 volt, a short-circuit current of 19.6 milliamperes, and a fill factor of 0.63. Its efficiency was 6.7%.

What is claimed is:

1. An improved cadmium sulfide photovoltaic cell comprising a cadmium sulfide bilayer, the bilayer being formed by deposition in interfacial contact with the substrate of an initial layer of cadmium sulfide formed at a first temperature and deposition of a second layer of cadmium sulfide formed at a second temperature which is at least 20° C. below the first temperature at which the initial cadmium sulfide layer is deposited, said second cadmium sulfide layer being in interfacial contact with a barrier layer.

2. A cell according to claim 1 wherein the second cadmium sulfide layer is deposited at a temperature from about 30° C. to about 60° C. below the temperature at which the initial cadmium sulfide layer is deposited.

3. A cell according to claim 2 wherein the second cadmium sulfide layer is deposited at a temperature about 50° C. below the temperature at which the initial cadmium sulfide layer is deposited.

4. A cell according to claim 1 wherein the cell comprises a barrier lamination of copper sulfide in intimate physical contact with the second cadmium sulfide lamination of the bilayer.

5. A cell according to claim 1 wherein the cell is activated by a heat treatment at a temperature of from about 100° C. to about 300° C.

6. A cell according to claim 1 wherein the cadmium bilayer contains a dopant.

7. A cell according to claim 6 wherein the initial cadmium sulfide layer contains from about 1 to about 50 weight percent of an aluminum dopant.

8. A method of fabricating an improved cadmium sulfide photovoltaic cell which comprises forming a cadmium bilayer by deposition of a cadmium sulfide lamination on another cadmium sulfide lamination, wherein the temperature at which the initial cadmium sulfide lamination is deposited is at least about 20° C. above the temperature at which the second cadmium sulfide lamination is deposited, said second cadmium sulfide layer being in interfacial contact with a barrier layer.

9. A process according to claim 8 wherein the second cadmium sulfide containing layer is deposited at a temperature from about 20° C. to about 100° C. below the temperature at which the initial cadmium sulfide containing layer is deposited.

10. A process according to claim 8 wherein the second cadmium sulfide containing layer is deposited at a temperature of from about 200° C. to about 450° C. and the initial cadmium sulfide layer is deposited at a temperature of from about 350° C. to about 500° C.

11. An improved cadmium sulfide photovoltaic cell comprising a cadmium sulfide bilayer, the bilayer consisting essentially of an initial layer of cadmium sulfide microcrystals having an average crystal diameter of from about 0.02 microns to about 0.1 microns and a second layer consisting essentially of microcrystals of cadmium sulfide having an average crystal diameter of from about 0.1 microns to about 0.5 microns.

12. An improved cadmium sulfide photovoltaic cell comprising a cadmium sulfide bilayer, the bilayer comprising an initial layer of cadmium sulfide microcrystals having an average crystal diameter of from about 0.02 microns to about 0.1 microns and a second cadmium sulfide layer comprising cadmium sulfide crystals having an average crystal diameter of from about 0.1 microns to about 0.5 microns, wherein said cadmium sulfide bilayer comprises a dopant and said second cadmium sulfide layer being in interfacial contact with a barrier layer.

13. A cell according to claim 12 wherein the initial cadmium sulfide layer comprises from about 1 to about 50 weight percent of an aluminum dopant.

* * * * *

Disclaimer 4,143,235.—*Jack A. Duisman*, El Cerrito, Calif. CADMIUM SULFIDE PHOTOVOLTAIC CELL AND METHOD OF FABRICATION. Patent dated Mar. 6, 1979. Disclaimer filed Sept. 9, 1982, by the assignee, *Chevron Research Co.*

Hereby enters this disclaimer to claims 6, 7, 12 and 13 of said patent.
[*Official Gazette November 16, 1982.*]